United States Patent [19]

Michel et al.

[11] 4,111,720

[45] Sep. 5, 1978

[54] METHOD FOR FORMING A NON-EPITAXIAL BIPOLAR INTEGRATED CIRCUIT

[75] Inventors: Alwin E. Michel, Ossining; Robert O. Schwenker, Hopewell Junction; James F. Ziegler, Putnam Valley, all of N.Y.

[73] Assignee: International Business Machines Corporation, Armonk, N.Y.

[21] Appl. No.: 783,245

[22] Filed: Mar. 31, 1977

[51] Int. Cl.$^2$ .................. H01L 21/265; H01L 21/26
[52] U.S. Cl. ..................................... 148/1.5; 357/50; 357/91
[58] Field of Search ..................... 148/1.5; 357/34, 91, 357/50

[56] References Cited

U.S. PATENT DOCUMENTS

| | | | |
|---|---|---|---|
| 3,293,084 | 12/1966 | McCaldin | 148/1.5 |
| 3,558,366 | 1/1971 | Lepselter | 148/1.5 |
| 3,585,714 | 6/1971 | Li | 29/580 |
| 3,640,806 | 2/1972 | Watanabe et al. | 204/143 GE |
| 3,655,457 | 4/1972 | Duffy et al. | 148/1.5 |
| 3,891,468 | 6/1975 | Ito et al. | 148/1.5 |
| 3,904,450 | 9/1975 | Evans et al. | 148/175 |
| 3,961,353 | 6/1976 | Aboaf et al. | 357/34 |
| 3,972,754 | 8/1976 | Riseman | 148/175 |
| 4,004,950 | 1/1977 | Baruch et al. | 148/1.5 |
| 4,045,251 | 8/1977 | Graul et al. | 148/1.5 |

OTHER PUBLICATIONS

Ziegler et al., "Self-Isolating Bath-tub Collector . . . Transistor", IBM Tech. Bull. Disc. 14, (1971) 1635.
F. W. Martin "Integrated E and *de/dx* . . . Detectors . . . by Ion Implantation", Nucl. Instr. and Methods 72 (1969) 223.
S. M. Ku et al., "Preventing Inversion . . . Large Scale . . . Devices" IBM Tech. Discl. Bull. 17 (1975) 2329.
J. Buie, "Improved Triple Diffusion Means Denseat I.Cs YET" Electronics, Aug. 1975, 101.
Ziegler et al., ". . . High Energy Ion Implantation . . . for Pedestal Collector," IBM Jr. of R & D, 15 (1971), 452.

*Primary Examiner*—R. Dean
*Assistant Examiner*—Upendra Roy
*Attorney, Agent, or Firm*—J. B. Kraft

[57] ABSTRACT

A method for forming a non-epitaxial bipolar integrated circuit comprising first forming in a silicon substrate of one-type of conductivity, recessed silicon dioxide regions extending into the substrate and laterally enclosing at least one silicon substrate region of said one-type conductivity. Then, forming by ion implantation the first region of opposite-type conductivity which is fully enclosed laterally by said recessed silicon dioxide. This region is formed by directing a beam of ions of opposite-type conductivity impurity at said enclosed silicon region at such energy and dosage levels that the opposite conductivity-type impurity introduced into the substrate in said region will have a concentration peak at a point below the surface of this first region. Then, a region of said one-type conductivity is formed which extends from the surface into said first opposite-type conductivity region to a point between said concentration peak and said surface. Next, a second region of said opposite-type conductivity is formed which extends from the surface part way into said region of one-type conductivity.

Preferably, the ion beam energy level is at least one MeV, and said concentration peak is at least one micron below the surface. It is further preferable that the energy and dosage levels of the beam of ions are selected so that the opposite-type conductivity impurity has a more gradual distribution gradient between the peak and the surface than between the peak and the junction of the first region with the substrate.

13 Claims, 6 Drawing Figures

METHOD FOR FORMING A NON-EPITAXIAL BIPOLAR INTEGRATED CIRCUIT

BACKGROUND OF THE INVENTION

The present invention relates to a method for the formation of non-epitaxial, vertical, bipolar integrated circuits. More particularly, it relates to the novel method involving ion implantation for forming such non-epitaxial bipolar integrated circuits.

For the last decade, planar, vertical bipolar integrated circuits have been produced predominantly by a conventional epitaxial deposition method which involves the formation of a highly doped substrate region which usually functions as the low resistance subcollector. Then, an epitaxial layer of silicon is deposited on such a silicon substrate and the base and emitter regions formed in this epitaxial layer by the subsequent introduction of impurities by either diffusion or ion implantation. Although it has been recognized that from a processing viewpoint, it would have been desirable to form the collector base and emitter of such bipolar devices directly in the substrate without an epitaxial layer, the problem which moved the field in the direction of epitaxial methods was that devices formed by direct introduction of collector, base emitter regions into the substrate did not exhibit a relatively low resistance path from the collector terminal down to the intrinsic collector-base junction. Since the epitaxial approach permitted the heavily doped, low resistance subcollector which ensured such a low resistance collector terminal path, the art predominantly used epitaxial techniques in forming vertical bipolar integrated circuitry, particularly in the high performance integrated circuitry required in high-speed digital computers.

While the bipolar integrated circuit art did find some limited usage for non-epitaxial or "epi-less" structures, e.g., structures formed by the triple diffusion of collector, base and emitter into the substrate, such structures were never considered to be feasible for the high-speed, high-performance integrated circuits.

With the development of the ion implantation art, methods of forming non-epitaxial integrated circuits were evolved which involved forming the collector region by ion implantation followed by the formation of base and emitter regions in the conventional manner. In such methods, the collector dopant or impurity was introduced at the surface of the silicon substrate and then distributed or driven deeper into the substrate by a thermal-distribution diffusion heating cycle. Such a method is described in the article, "Improved Triple Diffusion Means Densest ICs Yet," J. Buie, *Electronics*, Aug. 7, 1975, pp. 101–106. While such an ion implantation step solved one of the problems of the completely diffused collector, i.e., more uniform and consistent impurity distribution in the collector, it did not offer a solution to the above mentioned problem of providing the low resistance collector path required in high-performance integrated circuitry.

Other ion implanted collector techniques, i.e., "Self-Isolating Bathtub Collector for a Planar Transistor," J. E. Ziegler et al., *IBM Technical Disclosure Bulletin*, Vol. 14, No. 5, October 1971, pp. 1635–1636, involved the formation of a highly doped, low resistivity collector by a high energy ion implantation step. However, in order to carry out such a high energy ion implantation step utilizing the disclosed surface masking techniques a very thick layer of ion blocking masking material, about 3 to 4 microns in thickness, had to be used in order to prevent the penetration of the ions into the masked areas of the silicon substrate. For example, when using a silicon dioxide mask, its thickness must be in the order of 4 microns in order to prevent the penetration of the high energy ions. With such thick masks, it is very difficult to achieve sharp mask edge definition, i.e., the mask edge would be sloped. With such a sloped mask edge, the high energy ions will penetrate to varying degrees into the substrate through the mask edge depending on the thickness of the sloped edge at a particular penetration point, thus producing an undesirable sloped P-N collector base junction extending from the surface into the substrate. This sloped collector-base junction has a significantly greater slope than collector-base junctions of transistors produced by conventional epitaxial methods. As a result, there is an undesirable increase in lateral collector-base junction capacitances which will tend to slow down the operation of the device.

While the problems associated with the production of a non-epitaxial planar vertical bipolar integrated circuit have been described with respect to standard transistors wherein the emitter region is uppermost, a very similar set of problems are encountered in the production of non-epitaxial bipolar integrated circuits utilizing inverted transistors, i.e., transistors wherein the collector region is uppermost and the emitter is lowermost. For example, when non-epitaxial methods are used to form such inverted transistors, there is a similar problem with respect to providing a high doping level in the lowermost emitter region. In addition, the present method offers an expedient for reducing the thickness of lightly doped emitter portions between the peak concentration portion of the inverted emitter and base-emitter junction. This minimizes undesirable charge storage in this portion.

SUMMARY OF THE PRESENT INVENTION

Accordingly, it is a primary object of the present invention to provide a method involving ion implantation to form non-epitaxial planar vertical bipolar integrated circuits which display the high speeds required in high-performance integrated circuits.

It is another object of the present invention to provide a method involving ion implantation for forming non-epitaxial planar vertical bipolar integrated circuits having a highly doped buried collector region providing a low resistance path from the intrinsic collector-base junction.

It is yet another object of the present invention to provide a non-epitaxial planar vertical bipolar integrated circuit in which undesirable lateral collector-base capacitances are minimized.

The above and other objects of the present invention are achieved by a method for forming a planar vertical bipolar integrated circuit comprising first forming in a silicon substrate of one-type conductivity, recessed silicon dioxide regions extending into the substrate and laterally enclosing at least one silicon substrate region of said one-type conductivity. Then, directing a beam of ions of opposite-type conductivity impurities at said enclosed silicon region at energy and dosage levels sufficient to form a first region of said opposite-type conductivity defined and fully enclosed laterally by said recessed silicon dioxide region; the energy and dosage levels are selected so that the opposite-type conductivity impurity has a concentration peak at a point below the surface of this first region.

Next, a region of said one-type conductivity is formed extending from the surface into this opposite-type conductivity region to a point between the concentration peak and the surface, after which a second region of said opposite-type conductivity is formed extending from the surface part way into said region of one-type conductivity.

Preferably, the beam of ions of opposite-type conductivity used to form the first region is a high-energy beam having an energy level of at least one MeV, and the concentration peak is at least 1 micron below the surface. It is also desirable that the energy and dosage levels of the beams are selected so that the opposite-type conductivity impurity in the first region has a more gradual distribution gradient between the peak and the surface than between the peak and the junction of this first region with the substrate.

The method of the present invention may be used for production of conventional vertical bipolar integrated circuits wherein said first opposite-type conductivity region will function as a collector as well as for the fabrication of integrated circuits with inverted bipolar devices wherein said first opposite-type conductivity region will function as a "buried" emitter region.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1A:
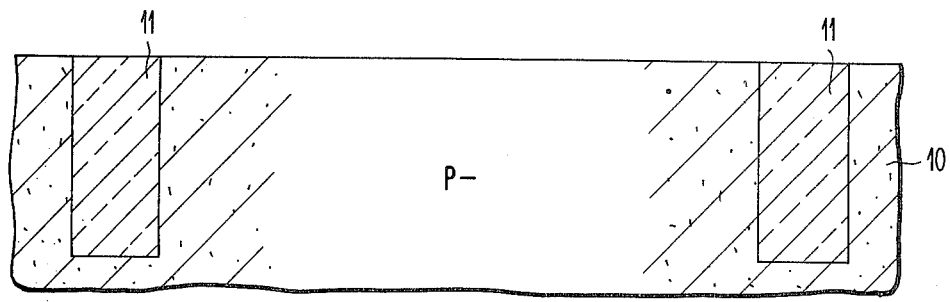
FIGS. 1A–1E are diagrammatic enlarged fragmentary cross-sectional views of a portion of an integrated circuit illustrating the steps involved in the formation of a vertical bipolar transistor in accordance with the present invention.

With reference to FIG. 1A, regions of recessed silicon dioxide 11 are formed in a silicon substrate which is P− and has a resistivity in the order of 10 ohm-cm. Recessed silicon dioxide regions 11 extend into substrate 10 about 5 microns. The recessed silicon dioxide regions may be formed by any of a number of conventional techniques for forming silicon dioxide regions embedded in a silicon substrate. Preferably, they are formed by techniques which involve the oxidation of the silicon substrate to form the silicon dioxide. Because it is desirable that the sidewalls of recessed silicon dioxide regions 11 be as vertical as possible, these regions are most preferably formed by a method which yields such vertical sidewalls. One such method involves first rendering porous those portions of the silicon substrate which are to be converted into silicon dioxide regions 11 followed by selectively oxidizing the porous silicon portions to silicon dioxide; such methods are described in U.S. Pat. Nos. 3,640,806 and 3,919,060. In accordance with the methods set forth in such patents, the silicon substrate to be converted to regions 11 is first heavily doped to a P+ level by the introduction of an impurity such as boron to a surface concentration ($C_0$) of about $2 \times 10^{20}$ atoms/cm$^3$, followed by anodically etching the substrate as described in said patents to selectively convert the P+ regions to porous silicon. Then, the porous silicon is converted into silicon dioxide under conditions wherein the porous silicon is selectively oxidized.

Of course, any conventional method for forming recessed silicon dioxide may be alternatively used, e.g., the method of U.S. Pat. No. 3,858,231 which involves etching recesses in the substrate and then subsequently thermally oxidizing to form silicon dioxide in such recesses. Also, if substantially vertical walls are desired, with the etch and thermal oxidation techniques described in said patent, then the recesses etched in the silicon may be formed by the technique of vertical-walled etching as described in the article entitled, "The Etching of Deep Vertical-Walled Patterns in Silicon," A. I. Stoller, *RCA Review*, June 1970, pp. 271–275. The recessed silicon dioxide region may also be formed by a combination of reactive ion etching using sputter-etching techniques to form relatively narrow deep trenches in the silicon followed by depositing silicon dioxide in the trenches.

Figure 1B:
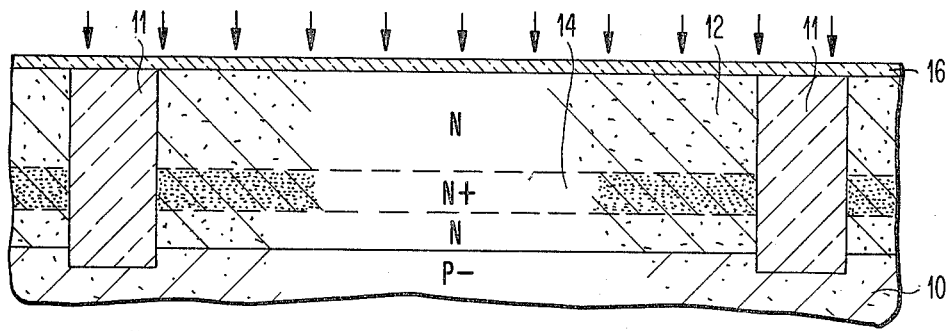

Then, as shown in FIG. 1B, the surface of the substrate is subjected to a blanket ion implantation of phosphorus ions at an energy level of 2.5 MeV and a dosage of $3 \times 10^{15}$ cm$^{-2}$. The ion implantation is carried out using standard expedients for making high energy ion implantations at energy levels in excess of 1 MeV as described, for example, in the article, "Experimental Evaluation of High Energy Ion Implantation Gradients for Possible Fabrication of a Transistor Pedestal Collector," J. F. Ziegler, et al., *IBM Journal of Research and Development*, Vol. 15, No. 6, November 1971.

Such high energy ion implantations may be accomplished using conventional ion implantation equipment as described, for example, in U.S. Pat. No. 3,756,862 except that as set forth in the Ziegler et al. article, the accelerator utilized must be one capable of providing a high energy beam and the accelerator stage is carried out prior to the mass analysis in the conventional manner. This ion implantation step produces an N-type region 12, which is laterally defined and enclosed by recessed silicon dioxide regions 11, which together with junction 13 electrically isolate region 12. When the ion implantation is carried out under the conditions described above, region 12 will have the impurity distribution profile, designated in the graph of FIG. 2. Region 12, which will function as the collector region in a vertical bipolar transistor, has a highly doped N+ buried region 14, about 2 microns below the surface which has a peak concentration, as indicated in FIG. 2, of at least $10^{18}$ atoms/cm$^3$ and preferably $10^{20}$ atoms/cm$^3$, as in the present example.

Figure 2:
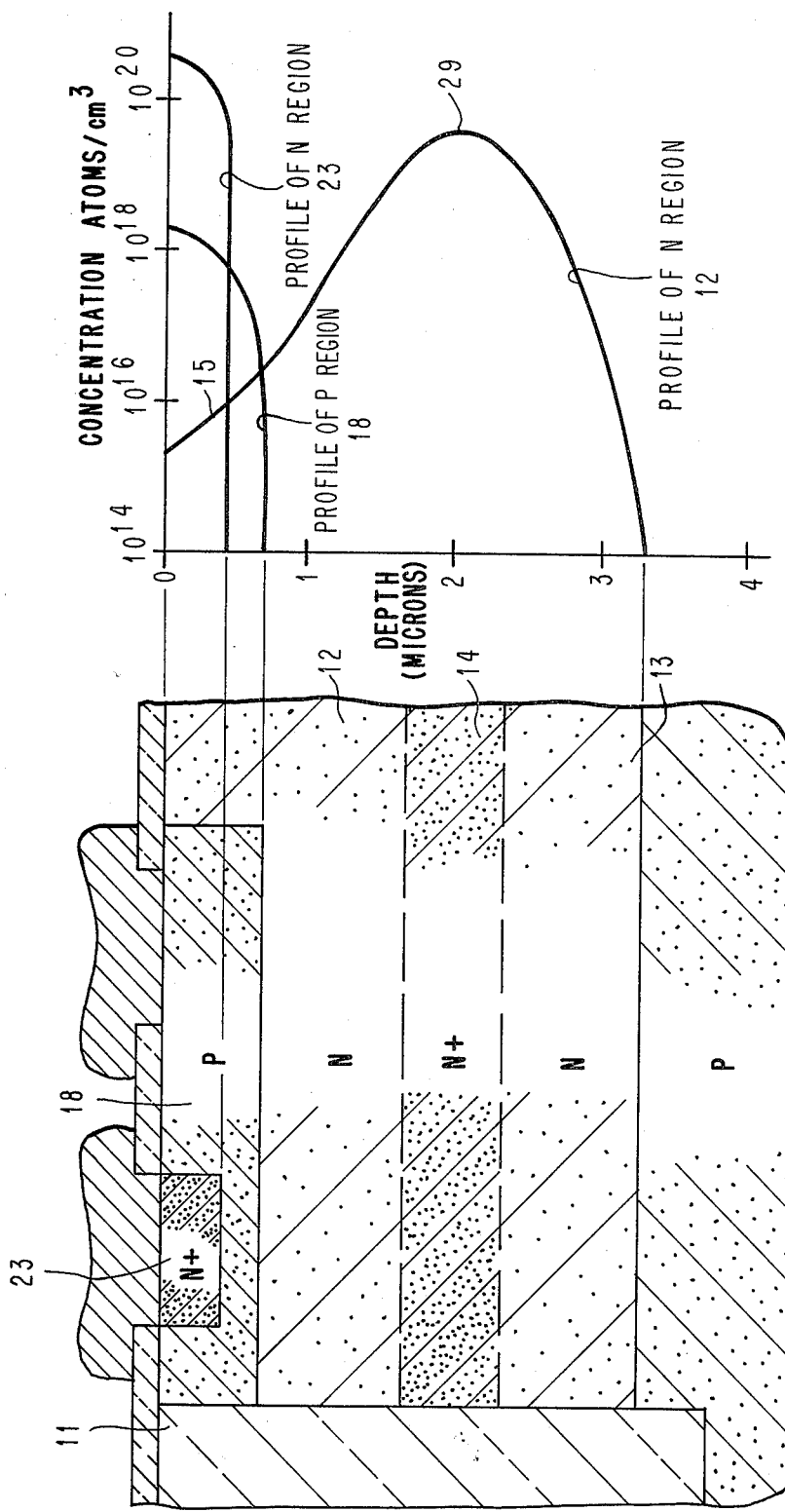
FIG. 2 is an enlarged cross-sectional view of the bipolar vertical transistor formed in accordance with the present invention and shown in FIG. 1E alongside of a graph showing the distribution, i.e., the concentration variation with depth of the impurities forming the first N-type region, the intermediate P-type region and the second N-type region in the cross-sectional view.

In addition, in order to minimize the possibility of inversion at the surface of collector region 12, it is desirable that the impurity distribution profile of region 12b, be such that the N-type impurity have a surface concentration ($C_0$) of at least $10^{15}$ atoms/cm$^3$, as indicated in FIG. 2. The distribution of the high energy implanted impurities consists of a main Gaussian peak and an exponential tail extending to the surface of the wafer. The concentration level of this exponential tail depends upon the dose and energy of the N-type impurity implant. When the ion implantation is carried out, at the energy and dosage level described above, the impurity distribution profile, of region 12, will have a "tail portion" 15 as the surface is approached, which ensures a $C_0$ of at least $10^{15}$ atoms/cm$^3$. In this "tail portion" of the impurity distribution profile, the distribution gradient becomes very gradual as the surface is approached.

When using the conventional phosphene source for the phosphorus ion in the present implantation, modification of the exponential tail regions can be achieved through adjustment of the phosphene ion source. By increase of the concentration of singly charged tetramers ($^{31}$P)$_4$+ in the ion source, phosphorus ions with energies equal to one-fourth of the accelerating potential (i.e., the tetramers) as well as energies equal to the full accelerating potential (i.e., $^{31}$P+) are implanted into the silicon wafer. The lower energy phosphorus ions produce a shoulder which elevates "tail" 15 (FIG. 2) on the surface side of the main Gaussian peak 29; this increases the concentration of phosphorus impurity at the substrate surface ($C_0$). Of course, the formation of these lower energy tetramers ($^{31}$P)$_4$+ will occur only when the mass analysis is carried out so as to pass the $^{31}$P+ species of ion and then remove the other species such as $^{32}$(PH)+. Also, when desirable, by adjustment of the analyzing magnet of the ion implantation apparatus to produce a beam of the phosphorus ion species $^{32}$(PH)+ available from the phosphene source, thereby removing the $^{31}$P+ species and consequently the lower energy tetramers thereof, the shoulder elevation of "tail" 15 can be eliminated.

In any event, where the $^{31}$P+ species is used, the level of the shoulder level of "tail" 15 or $C_0$ may be controlled by controlling the source to vary the tendancy toward tetramer formation, e.g., increased pressure on the source favors tetramer formation.

It should be noted that the profile, shown in FIG. 2, for N region 12, represents the distribution after a conventional anneal cycle carried out at a temperature in the order of 1000° C. for 60 minutes. This anneal cycle is carried out after the last region, the emitter is formed.

In addition, the collector region 12 may be formed by implanting directly onto the substrate or, as shown in FIG. 1B, through a thin layer of insulative material such as silicon dioxide about 1000 Å thick. This layer may be formed by any conventional technique such as sputter deposition, chemical vapor deposition or preferably by thermal oxidation. While in the present example, conditions have been given for achieving N regions with impurity distribution profiles having a peak at about 2 microns below the surface, the method of the present invention may be used to produce implanted regions with varying distribution profiles, and advantageously to produce regions with impurity distribution with peak concentration at distances of 1 micron and greater from the surface.

For example, with a dosage in the order of $10^{15}$ cm$^{-}$ from a conventional phosphorus source, and an anneal cycle of 30 minutes at 1000° C., an energy level of 1 MeV will provide for an impurity distribution profile with a peak concentration of $10^{19}$ atoms/cm$^3$ at a distance of about 1 micron from the surface while an energy level of 3 MeV will produce a distribution profile with a peak at about 2.4 microns from the surface. In both cases, the ion implantation may be carried out through a thin silicon dioxide (1000 Å) screen which may be provided by subjecting the substrate surface to a conventional thermal oxidation prior to the implantation step.

After the formation of collector region 12, the vertical bipolar integrated circuit may be completed by forming the base, the emitter, and standard resistors and contact regions by conventional integrated circuit fabrication techniques such as those described in U.S. Pat. No. 3,539,876. In addition, conventional insulative layers, metallic contacts and circuit interconnection metallurgy may also be provided in accordance with the techniques described in U.S. Pat. No. 3,539,866. Alternatively, to the diffusion techniques described in U.S. Pat. No. 3,539,876 for the formation of emitter, base and resistor regions, conventional ion implantation techniques may also be used for the formation of these regions. Conventionally, these are not the high energy techniques described above but rather low to moderate energy ion implantation which may be practiced on conventional equipment as that described in U.S. Pat. No. 3,756,862.

Figure 1C:
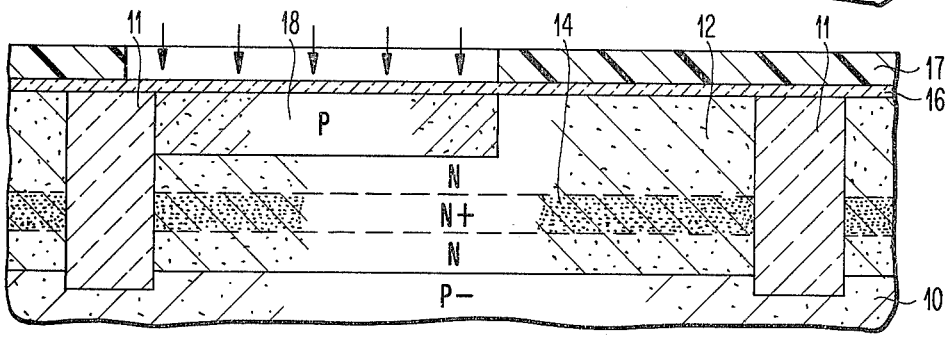

In any event, for the purposes of this illustration with reference to FIGS. 1C–1E, there will be described a process for forming emitter and base regions through ion implantation techniques. With reference to FIG. 1C, utilizing conventional techniques, a layer of silicon dioxide 16 remains intact. Next, an ion implantation blocking mask 17 is formed. This mask may conveniently be a photoresist type of blocking mask formed in accordance with the method of U.S. Pat. No. 3,920,483. The photoresist mask preferably has a thickness in the order of 1.5 microns. The photoresist mask 17 will define one edge of the base region to be ion implanted while the other edge will abut and be defined by a recessed silicon dioxide region 11. P region 18 which will serve as the base region is ion implanted from a boron source using the conventional equipment in the above described U.S. Pat. No. 3,756,862 at room temperature preferably in two steps: 50 KeV and dosage of $1 \times 10^{14}$ ions/cm$^2$ followed by 150 KeV and dosage of $3 \times 10^{13}$ ions/cm$^2$. P region 18 will have an impurity concentration profile as shown in the graph of FIG. 2 after the final post emitter anneal cycle.

Figure 1D:
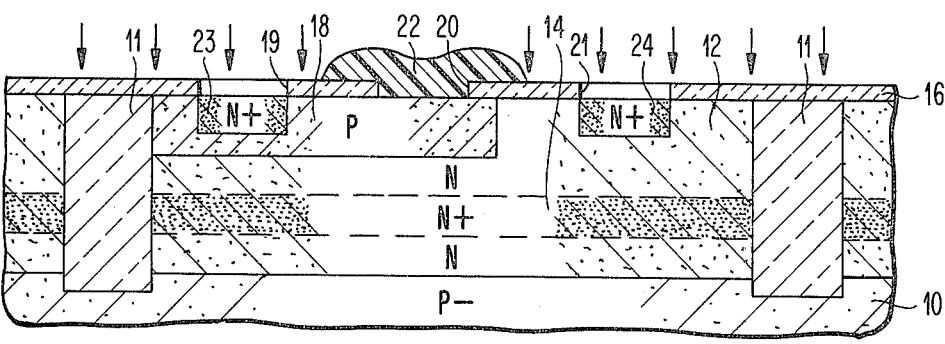
Figure 1E:
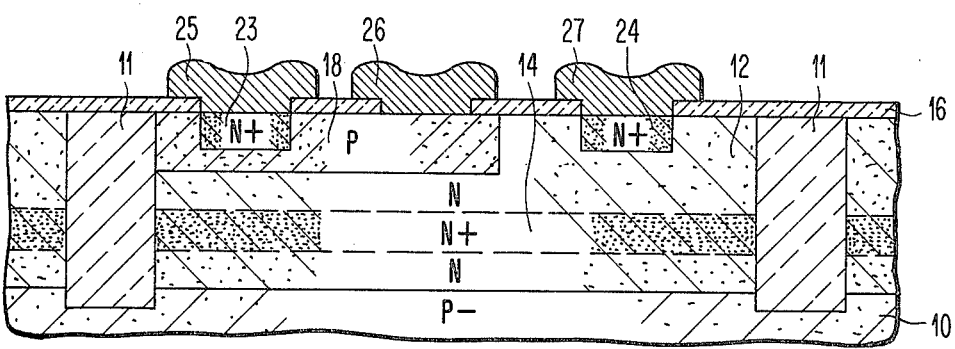

Next, FIG. 1D, utilizing conventional photolithographic etching techniques, emitter, base, and collector contact openings 19, 20 and 21 are respectively opened in silicon dioxide layer 16, after which base contact opening 20 is masked with an ion implantation blocking material such as photoresist layer 22 which may be formed in the manner described above, and a very low energy ion implantation is carried out at an energy level of 40 KeV and dosage level of $1 \times 10^{16}$ ions/cm$^2$ of arsenic ions to form emitter region 23 and collector contact region 24. The energy level is insufficient to penetrate through silicon dioxide layer 16. While the collector contact region may be formed as described above, it may be desirable to form the collector contact region 24 as a complete conventional "reach-through" to low resistance buried collector region 14. This may be accomplished by carrying out a preliminary implant into contact region 24 prior to this arsenic implant. This preliminary implant may be conveniently carried out either before or after the formation of base region 18. This implant is preferably of an N type material such as phosphorus which has a greater diffusivity rate than arsenic. For example, it may consist of a conventional phosphorus implant at an energy level of 150 KeV and a dosage of $5 \times 10^{15}$ cm$^{-2}$. Photoresist layer 22 is removed and the structure is subjected to the anneal cycle for about 60 minutes at a temperature of 1000° C. after which emitter region 23 has the impurity distribution profile shown in FIG. 2.

Finally, using the conventional integrated circuit fabrication techniques set forth in U.S. Pat. No. 3,539,876, metal emitter contact 25, base contact 26 and collector contact 27 are respectively formed connected to emitter base and collector region. Contacts 25, 26 and 27 are connected to and form part of a metallization pattern (not shown) formed on layer 16 which interconnects the devices in the integrated circuit. The resulting final structure is shown in FIGS. 1E and enlarged in FIG. 2.

While the specific example has been described with respect to an NPN-type vertical transistor, it will be obvious that PNP transistors and complementary bipolar transistors may also be formed in the manner described. In such PNP transistors, a P type impurity such as boron will be used to form the region with the buried high concentration portion. When an impurity such as boron which has a greater diffusivity rate than that of phosphorus is used to form the buried high concentration region, lower implantation energies in the order of 500 KeV may be used to form a buried region with a peak concentration at least 1 micron below the surface. In addition, the method of the present invention may be used to fabricate inverted transistors wherein the lowermost regions such as region 12 serve as emitter regions and the uppermost regions such as region 23 serve as collector regions. In the operation of the transistors fabricated in accordance with the present invention in either the conventional or inverted transistor mode, suitable voltage levels would be applied to contact regions 25, 26 and 27 to permit the transistor to operate in the selected mode.

While the invention has been particularly shown and described with reference to the preferred embodiments thereof, it will be understood by those skilled in the art that various changes in form and details may be made therein without departing from the spirit and scope of the invention.

What is claimed is:

1. A method for forming an integrated circuit comprising;
    forming in a silicon substrate of one-type conductivity, recessed silicon dioxide regions extending into said substrate and laterally enclosing at least one silicon substrate region of said one-type conductivity,
    directing a beam of ions of opposite-type conductivity impurities at said enclosed silicon region at energy and dosage levels sufficient to form a first region of said opposite-type conductivity defined and fully enclosed laterally by said recessed silicon dioxide regions,
        said opposite-type conductivity impurity having a concentration peak at a point below the surface of said first region
    forming a second region of said one-type conductivity extending from said surface into said opposite-type conductivity region to a point between said concentration peak and said surface, and
    forming a second region of said opposite-type conductivity extending from said surface part way into said second region of said one-type conductivity.

2. The method of claim 1 wherein said concentration peak is at least 1 micron below said surface.

3. The method of claim 1 further including conductive contacts to said regions and means for applying voltage levels respectively to said contacts whereby said first region of opposite-type conductivity functions as a collector, said second region of one-type conductivity functions as a base and said second region of opposite-type conductivity functions as an emitter of a bipolar transistor.

4. The method of claim 1 further including conductive contacts to said regions and means for applying voltage levels respectively to said contacts whereby said first region of opposite-type conductivity functions as an emitter, said second region of one-type conductivity functions as a base and said second region of opposite-type conductivity functions as a collector of a bipolar transistor.

5. The method of claim 1 wherein said recessed silicon dioxide regions are formed by first converting silicon substrate regions to porous silicon and then oxidizing said porous silicon to silicon dioxide.

6. The method of claim 1 wherein said silicon substrate regions are converted to porous silicon by the steps of
    increasing the one-type conductivity impurity concentration in the regions to be converted and
    anodically etching the substrate to selectively convert said high impurity concentration region to porous silicon.

7. The method of claim 1 wherein said second region of said one-type conductivity and said second region of opposite-type conductivity are formed by ion implantation.

8. The method of claim 2 wherein said beam energy level is at least 1 MeV.

9. The method of claim 8 wherein said energy and dosage levels of said beam of ions are selected so that said opposite-type conductivity impurity has a more gradual distribution gradient between said peak and said surface than between said peak and the junction of said first region of opposite-type conductivity with said substrate.

10. The method of claim 9 wherein said opposite-type conductivity impurity has a $C_0$ of at least $10^{15}$ atoms/cm$^3$.

11. The method of claim 10 wherein said peak has an impurity concentration of at least $5 \times 10^{18}$ atoms/cm$^3$.

12. The method of claim 10 wherein said opposite-type impurity is phosphorous provided by phosphene source and the surface concentration of the phosphorous atoms is controlled by controlling the concentration of $(^{31}P)_4^+$ ions in said beam.

13. The method of claim 11 wherein said opposite-type conductivity impurity has a concentration of less than $10^{17}$ atoms/cm$^3$ at the junction between said first region of opposite-type conductivity and said second region of one-type conductivity extending into said first region.

* * * * *